(12) United States Patent
Gao

(10) Patent No.: US 11,127,801 B2
(45) Date of Patent: Sep. 21, 2021

(54) ORGANIC LIGHT-EMITTING DIODE DISPLAY SUBSTRATE, METHOD OF MANUFACTURING THE SAME, AND DISPLAY APPARATUS

(71) Applicant: BOE TECHNOLOGY GROUP CO., LTD., Beijing (CN)

(72) Inventor: Tao Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 16/462,850

(22) PCT Filed: Sep. 4, 2018

(86) PCT No.: PCT/CN2018/103895
§ 371 (c)(1),
(2) Date: May 21, 2019

(87) PCT Pub. No.: WO2019/105088
PCT Pub. Date: Jun. 6, 2019

(65) Prior Publication Data
US 2021/0104585 A1 Apr. 8, 2021

(30) Foreign Application Priority Data
Nov. 30, 2017 (CN) .......................... 201711249222.7

(51) Int. Cl.
*H01L 27/32* (2006.01)
*H01L 51/52* (2006.01)
(52) U.S. Cl.
CPC ...... *H01L 27/3246* (2013.01); *H01L 27/3276* (2013.01); *H01L 51/5209* (2013.01); *H01L 51/5225* (2013.01)

(58) Field of Classification Search
CPC ...................... H01L 27/3246; H01L 27/3276
See application file for complete search history.

(56) References Cited

U.S. PATENT DOCUMENTS

| 2004/0157564 A1 | 8/2004 | Murakami et al. |
| 2015/0243716 A1 | 8/2015 | Kwon et al. |

(Continued)

FOREIGN PATENT DOCUMENTS

| CN | 101853789 A | 10/2010 |
| CN | 103311222 A | 9/2013 |

(Continued)

OTHER PUBLICATIONS

International Search Report and English Translation of Box V of the Written Opinion dated Nov. 16, 2018, received for corresponding Chinese PCT Application No. PCT/CN2018/103895, 10 pages.

(Continued)

*Primary Examiner* — Farun Lu
(74) *Attorney, Agent, or Firm* — Kinney & Lange, P.A.

(57) ABSTRACT

An organic light-emitting diode display substrate, a method of manufacturing the same, and a display apparatus are provided. The organic light-emitting diode display substrate includes: a base substrate; a pixel defining layer on the base substrate and defining a plurality of pixel regions, wherein a first electrode, a second electrode and an organic light-emitting functional layer between the first electrode and the second electrode are disposed in each of at least two adjacent ones of the plurality of pixel regions; and a conducting wire on the pixel defining layer and configured to connect the second electrodes located in the at least two adjacent pixel regions.

16 Claims, 7 Drawing Sheets

(56) References Cited

U.S. PATENT DOCUMENTS

2015/0349291 A1*  12/2015  Song .................... H01L 27/322
                                                  257/40
2018/0114820 A1*   4/2018  Shim ................... H01L 27/3248

FOREIGN PATENT DOCUMENTS

| CN | 104022139 A | 9/2014 |
| CN | 104867955 A | 8/2015 |
| CN | 107808897 A | 3/2018 |

OTHER PUBLICATIONS

Ji Xudong, The New Technology for Manufacturing Low-Temperature Poly-Si Film, 2003, 10 pages, vol. 44 No. 1, Electro-Optics Technology.

* cited by examiner

ORGANIC LIGHT-EMITTING DIODE DISPLAY SUBSTRATE, METHOD OF MANUFACTURING THE SAME, AND DISPLAY APPARATUS

CROSS-REFERENCE TO RELATED APPLICATION

This application is a Section 371 National Stage Application of International Application No. PCT/CN2018/103895, filed on Sep. 4, 2018, entitled "ORGANIC LIGHT-EMITTING DIODE DISPLAY SUBSTRATE, METHOD OF MANUFACTURING THE SAME, AND DISPLAY APPARATUS", which has not yet published, which claims priority to Chinese Application No. 201711249222.7, filed on Nov. 30, 2017, incorporated herein by reference in their entirety.

TECHNICAL FIELD

Embodiments of the present disclosure relate to the field of display technology, and particularly to an organic light-emitting diode display substrate, a method of manufacturing the same, and a display apparatus.

BACKGROUND

An organic light-emitting diode (OLED) display substrate has advantages such as active illumination, good temperature characteristics, low power consumption, fast response, flexibility, ultra-lightweight, ultra-thinness and low cost, and has been widely applied to display apparatus.

SUMMARY

The present disclosure provides an organic light-emitting diode display substrate, comprising: a base substrate; a pixel defining layer on the base substrate and defining a plurality of pixel regions, wherein a first electrode, a second electrode and an organic light-emitting functional layer between the first electrode and the second electrode are disposed in each of at least two adjacent ones of the plurality of pixel regions; and a conducting wire on the pixel defining layer and configured to connect the second electrodes located in the at least two adjacent pixel regions.

In some embodiments, an orthogonal projection of each of the second electrodes in the at least two adjacent pixel regions on the base substrate coincides partially with an orthogonal projection of the conducting wire on the base substrate.

In some embodiments, a material of the conducting wire is the same as a material of the second electrodes, or the material of the conducting wire has lower resistivity than the material of the second electrodes.

In some embodiments, the conducting wire has a greater thickness than the second electrodes.

In some embodiments, orthogonal projections of the second electrode and the organic light-emitting functional layer in each of the at least two adjacent pixel regions on the base substrate coincide with each other.

In some embodiments, the plurality of pixel regions are arranged at intervals in an array and the first electrode, the second electrode and the organic light-emitting functional layer between the first electrode and the second electrode are disposed in each of the plurality of pixel regions.

In some embodiments, the conducting wire comprises a plurality of first conducting wires, and each of the plurality of first conducting wires is located between two adjacent columns of pixel regions of the plurality of pixel regions, and is electrically connected to the second electrode in each of the two adjacent columns of pixel regions.

In some embodiments, the conducting wire comprises a plurality of second conducting wires, and each of the plurality of second conducting wires is located between two adjacent rows of pixel regions of the plurality of pixel regions, and is electrically connected to the second electrode in each of the two adjacent rows of pixel regions.

In some embodiments, the conducting wire has a mesh shape, defines a plurality of openings each corresponding to one of the plurality of pixel regions, and is electrically connected to the second electrode in each of the plurality of pixel regions.

In some embodiments, the second electrodes in the at least two adjacent pixel regions form a continuous electrode layer.

In some embodiments, the second electrodes in all of the plurality of pixel regions form a continuous electrode layer.

In some embodiments, the second electrodes in the at least two adjacent pixel regions are separated from each other.

In some embodiments, the first electrode comprises an anode, and the second electrode comprises a cathode.

An embodiment of the present disclosure provides a display apparatus comprising the organic light-emitting diode display substrate according to any one of the above embodiments.

An embodiment of the present disclosure provides a method of manufacturing an organic light-emitting diode display substrate, the method comprising: sequentially forming a first electrode layer and a pixel defining layer on a base substrate, wherein the first electrode layer comprises a plurality of first electrodes, the pixel defining layer defines a plurality of pixel regions, and in each of at least two adjacent ones of the plurality of pixel regions, one of the plurality of first electrodes is disposed; sequentially forming an organic light-emitting functional layer and a second electrode on the first electrode in each of the at least two adjacent pixel regions; and forming a conducting wire on the pixel defining layer, wherein the conducting wire is configured to connect the second electrodes located in the at least two adjacent pixel regions.

In some embodiments, an orthogonal projection of the second electrode in each of the at least two adjacent pixel regions on the base substrate coincides partially with an orthogonal projection of the conducting wire on the base substrate.

In some embodiments, the conducting wire is formed of a same material as the second electrodes, or a material of the conducting wire has lower resistivity than a material of the second electrodes.

In some embodiments, the conducting wire has a greater thickness than the second electrodes.

In some embodiments, the organic light-emitting functional layer and the second electrode in each of the at least two adjacent pixel regions are formed by means of a same mask.

In some embodiments, the second electrodes in the at least two adjacent pixel regions form a continuous electrode layer.

BRIEF DESCRIPTION OF THE DRAWINGS

The drawings described herein are used to provide further understanding of technical solutions of the present disclosure and constitute a part of the description. The technical solutions of the present disclosure are explained by means of the drawings together with the following embodiments of the present application but should not be construed as being limited to the drawings.

DETAILED DESCRIPTION

In order that objects, technical solutions and advantages of the present disclosure become more apparent, the embodiments of the present disclosure will be described in detail with reference to the drawings as below. It should be noted that the embodiments of the present application and/or the features in the embodiments may be discretionarily combined with one another unless they conflict.

Unless otherwise defined, technical or scientific terms used in the embodiments of the present disclosure should have the same meaning as commonly understood by one of ordinary skill in the art to which the present disclosure pertains. The terms "first" and "second" and similar words and phrases used in the embodiments of the present disclosure are used for only distinguishing different components from one another rather than indicating any sequence, number or importance. The term "comprises", "comprising", "includes", "including" or any other similar word or phrase is to be construed to specify that an element or thing that appears before the term covers an element or thing that appears after the term and is listed and its equivalent, but do not exclude other elements or things. The term "connected" or any other similar word or phrase is not limited to a physical or mechanical connection but may include an electrical connection, regardless of a direct connection or an indirect connection. The terms "upper", "lower", "left", "right" and the like are only used to indicate relative positional relationships, and when an absolute position of the object being described is changed, the relative positional relationships may also change accordingly.

According to the research by the inventor(s), a cathode layer in an OLED display substrate in a related art has a great resistance so that the OLED display substrate is not uniform in display luminance, thereby adversely affecting a display quality.

Figure 1:
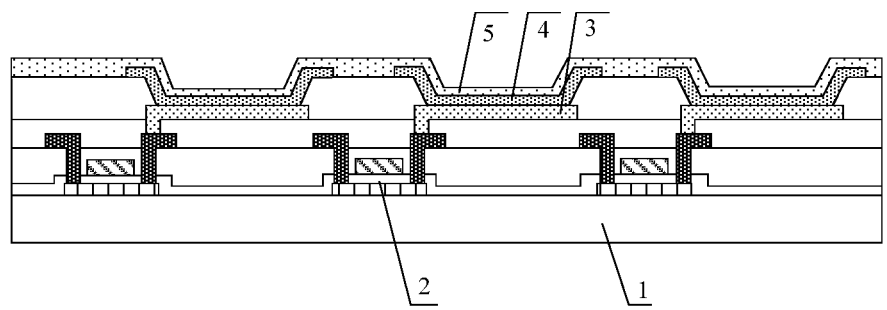
FIG. 1 is a schematic sectional view showing a structure of an OLED display substrate in related art.

FIG. 1 is a schematic sectional view showing a structure of an OLED display substrate in related art. As shown in FIG. 1, the OLED display substrate includes: a base substrate 1; a plurality of thin film transistors 2 disposed on the base substrate; and a plurality of anodes 3; a plurality of organic light-emitting functional layers 4; and a cathode 5. The cathode 5 covers the entire base substrate 1, and all of pixel regions share the single cathode 5. The cathode has a crucial influence on the performance of a top-emission OLED, and should have good transmissivity and conductivity. A conventional cathode is mainly made of a high-conductivity metal material such as silver. A film as the cathode is uniformly coated during a coating process, and the conductivity and the transmissivity of the cathode is balanced by adjusting a thickness of the metal film.

According to the research by the inventor(s), the thickness of an existing cathode is necessarily small on the premise that the existing cathode satisfies the transmissivity. In this case, the entire cathode has a great resistance and a voltage drop in each of the pixel regions is remarkable so that the voltage drop is not uniform everywhere. As a result, an OLED display substrate is not uniform in light emission and is poor in display quality.

In order to solve the technical problem that the OLED display substrate is not uniform in light emission and is poor in display quality due to the great resistance of the cathode, embodiments of the present disclosure provide an OLED display substrate, a method of manufacturing the same, and a display apparatus.

Figure 2:
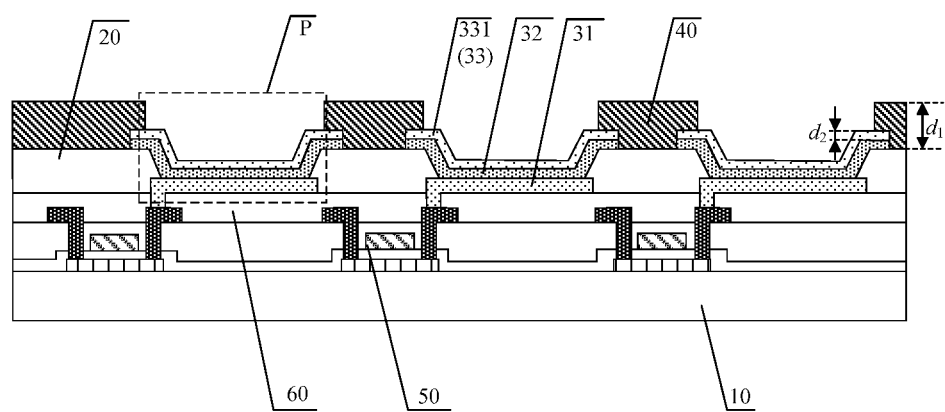
FIG. 2 is a schematic sectional view showing a structure of an OLED display substrate provided by an embodiment of the present disclosure.

An organic light-emitting diode (OLED) display substrate, hereinafter referred to as OLED display substrate for short, provided by an embodiment of the present disclosure includes: a base substrate; and a pixel defining layer disposed on the base substrate and defining a plurality of pixel regions. A first electrode such as an anode, a second electrode such as a cathode, and an organic light-emitting functional layer disposed between the first electrode and the second electrode are disposed in each of at least two adjacent ones of the plurality of pixel regions. The OLED display substrate further includes a conducting wire disposed on the pixel defining layer and configured to connect the second electrodes located in the at least two adjacent pixel regions. In the following description, the embodiments of the present disclosure are explained in detail by taking as an example the anode as the first electrode, the cathode as the second electrode, and a cathode conducting wire as the conducting wire. An embodiment of the present disclosure provides an OLED display substrate. FIG. 2 is a schematic sectional view showing a structure of the OLED display substrate provided by an embodiment of the present disclosure. As shown in FIG. 2, the OLED display substrate provided by the embodiment of the present disclosure includes: a pixel defining layer 20 disposed on a base substrate 10. The pixel defining layer 20 as a whole has a mesh shape and defines a plurality of pixel regions P arranged in an array and separated from one another. An anode 31 and an organic light-emitting functional layer 32 are disposed in each of the plurality of pixel regions P. A cathode layer 33 completely covers each of the organic light-emitting functional layers 32, and covers at least a portion of a top of the pixel defining layer 20. In the present embodiment, the cathode layer 33 includes a plurality of cathodes 331 arranged in an array and separated from one another. The plurality of cathodes 331 correspond to the plurality of pixel regions P, respectively, and each of the plurality of cathodes 331 completely covers the organic light-emitting functional layer 32 in one of the plurality of pixel regions P, and covers an edge region, adjacent to the one pixel region P, of the top of the pixel defining layer 20. A cathode conducting wire 40 is disposed on the top of the pixel defining layer 20. The cathode conducting wire 40 is configured to electrically connect the cathodes 331 located in the plurality of pixel regions, thereby reducing a resistance of the cathode layer 33. An orthogonal projection of the cathode conducting wire 40 on the base substrate 10 falls within an orthogonal projection of the top of the pixel defining layer 20 on the base substrate 10.

Optionally, the plurality of pixel regions may be defined to emit lights of the same color or different colors.

In the present embodiment, since the cathode conducting wire 40 is disposed on the top of the pixel defining layer 20, i.e. the cathode conducting wire 40 does not cover the pixel regions, the cathode conducting wire 40 does not affect a transmittance of a light in a display area.

It is to be noted that a resistance per unit length of the cathode conducting wire in the present embodiment is less than a resistance per unit length of a cathode layer disposed on the pixel defining layer and having the same width as the cathode conducting wire in the related art.

In the present embodiment, the OLED display substrate is a top-emission OLED display substrate. The OLED display substrate further includes: a plurality of thin film transistors 50 and a planarization layer 60. Specifically, the plurality of thin film transistors 50 are disposed on the base substrate 10, and the planarization layer 60 is disposed on the thin film transistors 50 and covers the entire base substrate 10. The plurality of anodes 31 are electrically connected to drain electrodes of the plurality of thin film transistors 50, respectively. Since the anodes 31 are electrically connected to the drain electrodes of the thin film transistors 50, respectively, each row of thin film transistors may be turned on line by line by gate scanning signals in the OLED display substrate, so that data voltages are transmitted to the anodes 31 by the thin film transistors 50. The anodes 31, together with the corresponding cathodes 331, form voltage differences for driving organic light-emitting materials in the organic light-emitting functional layers 32 to emit lights, so that the OLED display substrate self-emit lights. It is to be noted that the thin film transistor 50 in the embodiments of the present disclosure has a top-gate structure. In other embodiments, the thin film transistor may have a bottom-gate structure.

Optionally, each cathode 331 is disposed on the corresponding organic light-emitting functional layer 32 and has a same pattern as the organic light-emitting functional layer 32. In other words, orthogonal projections of the cathode 331 and the corresponding organic light-emitting functional layer 32 in each pixel region on the base substrate 10 coincide with each other.

It is to be noted that in order to achieve a good electric contact between the cathode 33 and the cathode conducting wire 40, an orthogonal projection of the cathode layer 33 on the base substrate 10 coincides partially with an orthogonal projection of the cathode conducting wire 40 on the base substrate 10. In other words, the cathode conducting wire 40 covers a part of the cathode layer 33. In the present embodiment, as shown in FIG. 2, each cathode 331 of the cathode layer 33 covers an edge region, adjacent to the pixel region P where the each cathode 331 is located, of the top of the pixel defining layer 20, and the cathode conducting wire 40 covers the top of the pixel defining layer 20 including the edge regions. An edge of each cathode 331 is interposed between the pixel defining layer 20 and the cathode conducting wire 40, and is in direct electric contact with the cathode conducting wire 40. Thereby, the cathode conducting wire 40 is in good electric contact with each cathode 331 of the cathode layer 33 to provide each cathode 331 with a same cathode potential.

Figure 3A:
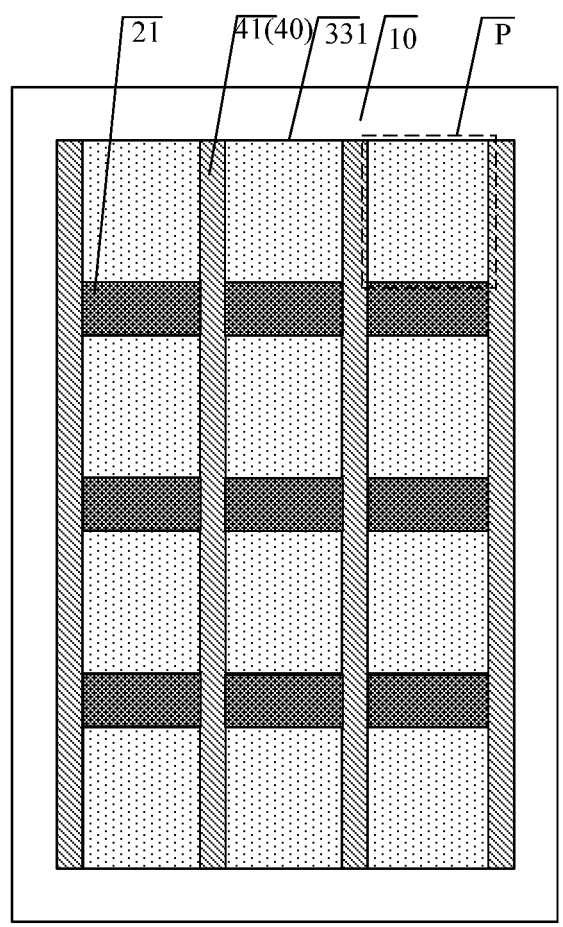
FIG. 3A is a top view of an OLED display substrate provided by an embodiment of the present disclosure.

In an embodiment, the cathode conducting wire 40 may have various structures. Optionally, FIG. 3A is a top view of an OLED display substrate provided by an embodiment of the present disclosure, as shown in FIG. 3A, the cathode conducting wire 40 includes a plurality of first cathode conducting wires 41, and each of the plurality of first cathode conducting wires 41 is located between two adjacent columns of pixel regions P. Referring also to FIG. 2, the first cathode conducting wire 41 is in electric contact with each of the cathodes 331 located on the organic light-emitting functional layers 32 in the two adjacent columns of pixel regions P.

Figure 3B:
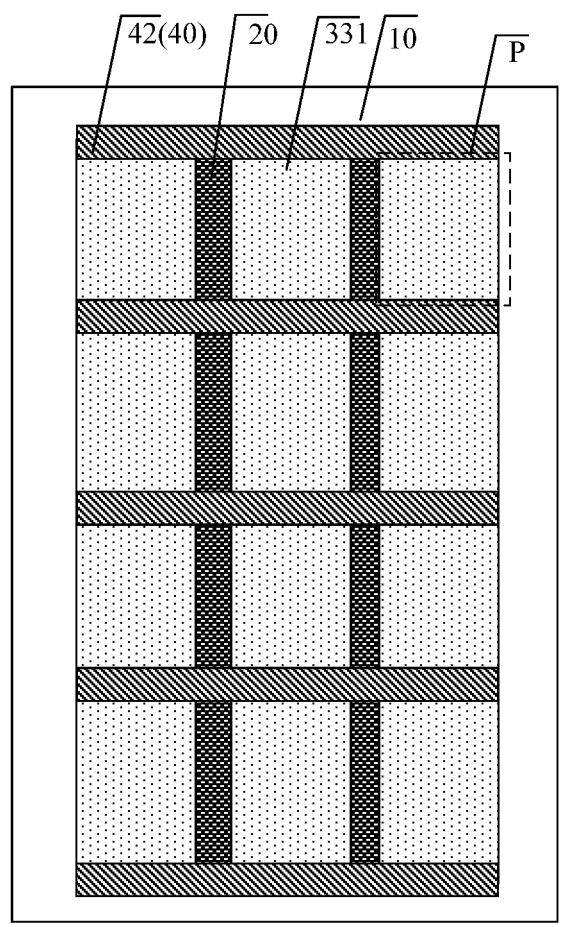
FIG. 3B is a top view of an OLED display substrate provided by an embodiment of the present disclosure.

Optionally, FIG. 3B is a top view of an OLED display substrate provided by an embodiment of the present disclosure, as shown in FIG. 3B, the cathode conducting wire 40 includes a plurality of second cathode conducting wires 42, and each of the plurality of second cathode conducting wires is located between two adjacent rows of pixel regions P. Referring also to FIG. 2, the second cathode conducting wire 42 is in electric contact with each of the cathodes 331 located on the organic light-emitting functional layers 32 in the two adjacent rows of pixel regions P.

Figure 3C:
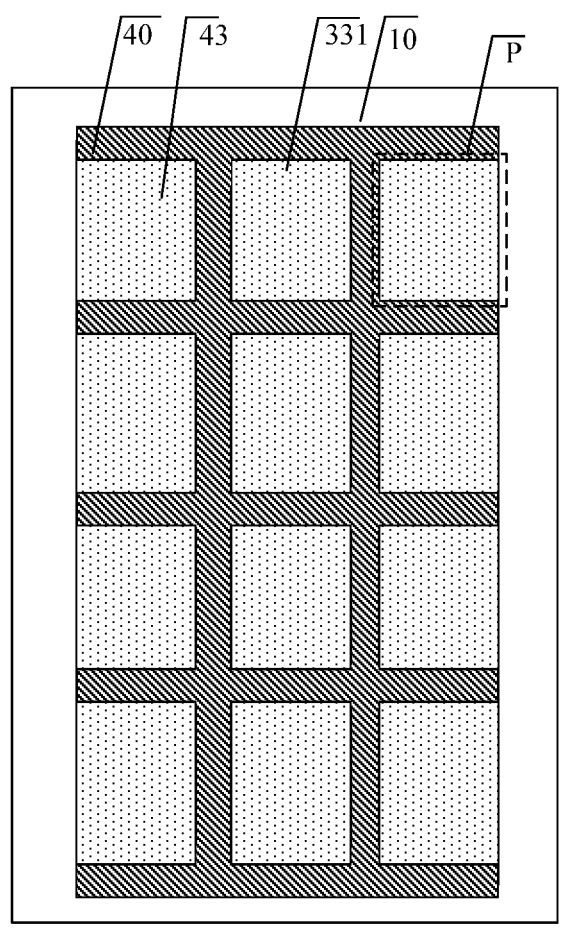
FIG. 3C is a top view of an OLED display substrate provided by an embodiment of the present disclosure.

Optionally, FIG. 3C is a top view of an OLED display substrate provided by an embodiment of the present disclosure, as shown in FIG. 3C, the cathode conducting wire 40 has a mesh shape and covers the top of the mesh-shaped pixel defining layer 20. The cathode conducting wire 40 defines a plurality of openings 43 each exposing one of the plurality of pixel regions P. Referring also to FIG. 2, each of the cathodes 331 on the organic light-emitting functional layers in the plurality of pixel regions P is in electric contact with a portion of the conducting wire 40 located at an edge of each of the plurality of openings.

Optionally, in order to ensure a conductivity of the cathode layer 33, a material of the cathode conducting wire 40 includes a metal or an alloy. It is to be noted that the material of the cathode conducting wire 40 may be the same as or different from a material of the cathode layer 33, which is specifically defined according to actual requirements and on which there is no limitation in the present disclosure.

In an embodiment, the material of the cathode layer 33 is the same as the material of the cathode conducting wire 40, and a thickness d1 of the cathode conducting wire 40 is greater than a thickness d2 of the cathode layer 33. Optionally, the thickness d1 of the cathode conducting wire 40 is 3-5 times the thickness d2 of the cathode layer 33.

In an embodiment, the material of the cathode layer 33 is different from the material of the cathode conducting wire 40, and a resistivity of the material of the cathode conducting wire 40 is less than a resistivity of the material of the cathode layer 33. Specifically, common materials in increasing order of resistivity are: silver, copper, gold, aluminum, magnesium, and molybdenum. If the material of the cathode conducting wire 40 is silver, the material of the cathode layer 33 may be copper, gold, aluminum, magnesium, or molybdenum. If the material of the cathode conducting wire 40 is copper, the material of the cathode layer 33 is gold, aluminum, magnesium, or molybdenum. In other words, the material of the cathode layer 33 is selected depending upon a selection of the material of the cathode conducting wire 40. There is no specific limitation on the material of the cathode conducting wire and the material of the cathode layer in the present disclosure.

Optionally, the base substrate 10 is a flexible base substrate. It should be understood that a material of the flexible base substrate includes, for example, polyimide.

Optionally, different materials of the anodes and the cathode layer are selected depending upon a different structure of the OLED display substrate. For example, the material of the anode is generally selected from transparent or translucent materials having good electrical conductivity and chemical stability and a high work function, such as indium tin oxide, silver, nickel oxide and graphene, and the anode may have a thickness of, for example, 1-2 µm. For example, the material of the cathode layer is generally selected from metal materials or alloy materials having a low work function. Moreover, in order to overcome a problem that a metal having a low work function, such as calcium, potassium, and lithium has a high chemical activity, the material of the cathode may be an alloy of the metal having the low work function and a corrosion resistant metal, such as a silver-magnesium alloy and an aluminum-lithium alloy.

Optionally, the pixel defining layer 20 has a thickness of 1.5-3 µm. The material for the pixel defining layer may be, for example, an inorganic material (such as silicon nitride or silicon oxide), an organic material (such as polyimide or polytetrafluoroethylene), a photoresist (such as polyvinyl alcohol or laurate), or the like. There is no limitation on the material for the pixel defining layer in the present disclosure.

Optionally, the organic light-emitting functional layers 32 are configured to emit at least one of a red light, a green light, or a blue light.

Figure 4:
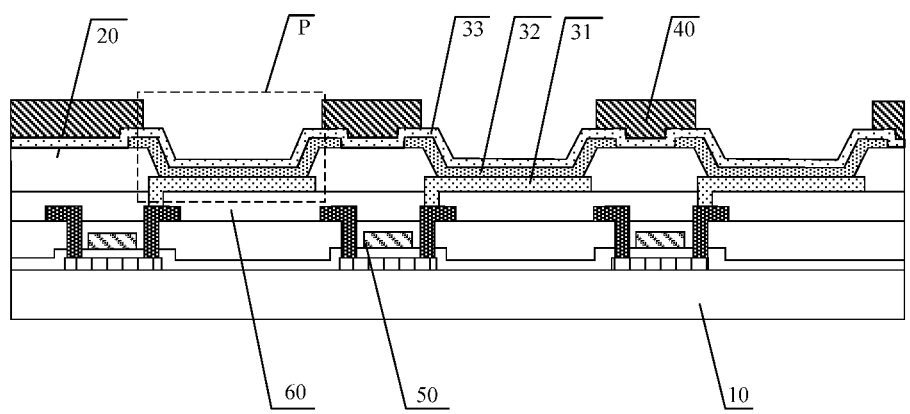
FIG. 4 is a schematic sectional view showing a structure of an OLED display substrate provided by an embodiment of the present disclosure.

An embodiment of the present disclosure provides an OLED display substrate. FIG. 4 is a schematic sectional view showing a structure of an OLED display substrate provided by an embodiment of the present disclosure. The OLED display substrate provided in the present embodiment is similar in structure to the OLED display substrate provided in the embodiment corresponding to FIG. 2, and the difference between them is that in the present embodiment, as shown in FIG. 4, the cathode layer 33 is a continuous electrode layer covering the pixel defining layer 20 and all of the plurality of pixel regions P. The cathode conducting wire 40 is disposed directly on a portion of the cathode layer 33 covering the top of the pixel defining layer 20, and the cathode conducting wire 40 is in good electric contact with the cathode layer 33, thereby reducing a resistance of the entire continuous electrode layer.

The cathode conducting wire 40 in the present embodiment may have various structures. Optionally, referring to FIG. 3A, the cathode conducting wire 40 includes a plurality of first cathode conducting wires 41, and each of the plurality of first cathode conducting wires 41 is located between two adjacent columns of pixel regions P. Optionally, the cathode conducting wire 40 includes a plurality of second cathode conducting wires 42, and each of the plurality of second cathode conducting wires is located between two adjacent rows of pixel regions P. Optionally, the cathode conducting wire 40 has a mesh shape and covers the top of the mesh-shaped pixel defining layer 20. The cathode conducting wire 40 defines a plurality of openings 43 each exposing one of the plurality of pixel regions P.

In an alternative embodiment, the cathode layer 33 is not a continuous electrode layer, but includes a plurality of cathode regions separated from one another and each corresponding to a plurality of pixel regions. In other words, the cathodes 331 corresponding to the plurality of pixel regions are spliced into one cathode region. For example, the cathode layer includes a plurality of cathode regions parallel to one another, each cathode region corresponds to one or more rows of pixel regions or one or more columns of the pixel regions. In this case, the cathode conducting wire 40 may also have various structures similar to those shown in FIGS. 3A-3C, which are no longer described herein for the sake of brevity.

Figure 5:
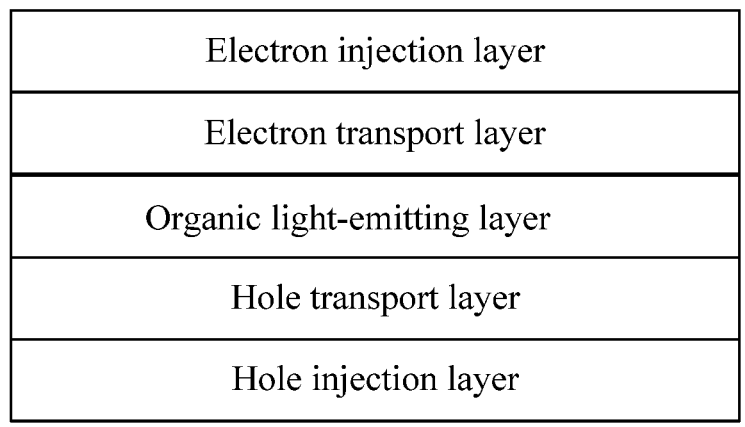
FIG. 5 is a schematic view showing a structure of an organic light-emitting functional layer provided by an embodiment of the present disclosure.

FIG. 5 is a schematic view showing a structure of an organic light-emitting functional layer provided by an embodiment of the present disclosure. Light emitted by the organic light-emitting functional layer exits from the OLED display substrate through the cathode. As shown in FIG. 5, the organic light-emitting functional layer includes: an organic light-emitting layer, an electron injection layer, an electron transport layer, a hole injection layer, and a hole transport layer, which are stacked. The electron injection layer and the hole injection layer are disposed on both sides, such as an upper side and a lower side, of the organic light-emitting layer, respectively. Holes injected from the anode and electrons injected from the cathode combine to form excitons in the organic light-emitting layer. The excitons excite luminescent molecules. The excited luminescent molecules emit visible light through radiation relaxation. The hole transport layer is made of a hole transport material. The hole transport material may be a triaryl amine series, a benzidine derivative, or a crosslinked benzidine. The electron transport layer is made of an electron transport material.

The OLED display substrate provided by the embodiments of the present disclosure includes: the pixel defining layer disposed on the base substrate and defining the plurality of pixel regions. The anode, the organic light-emitting functional layer, and the cathode are disposed in each of at least two adjacent ones of the plurality of pixel regions. The cathode conducting wire is disposed on the pixel defining layer and is configured to connect the cathodes located in at least two adjacent pixel regions. With the technical solution according to the embodiments of the present disclosure, the cathode conducting wire, connecting the cathodes located in adjacent pixel regions, is disposed on the pixel defining layer. Hence, the resistance of the entire cathode layer is reduced so that a voltage drop is uniformly distributed in the pixel regions, thereby improving the uniformity of light emitted from the OLED display substrate and the display quality of the OLED display substrate.

Figure 6:
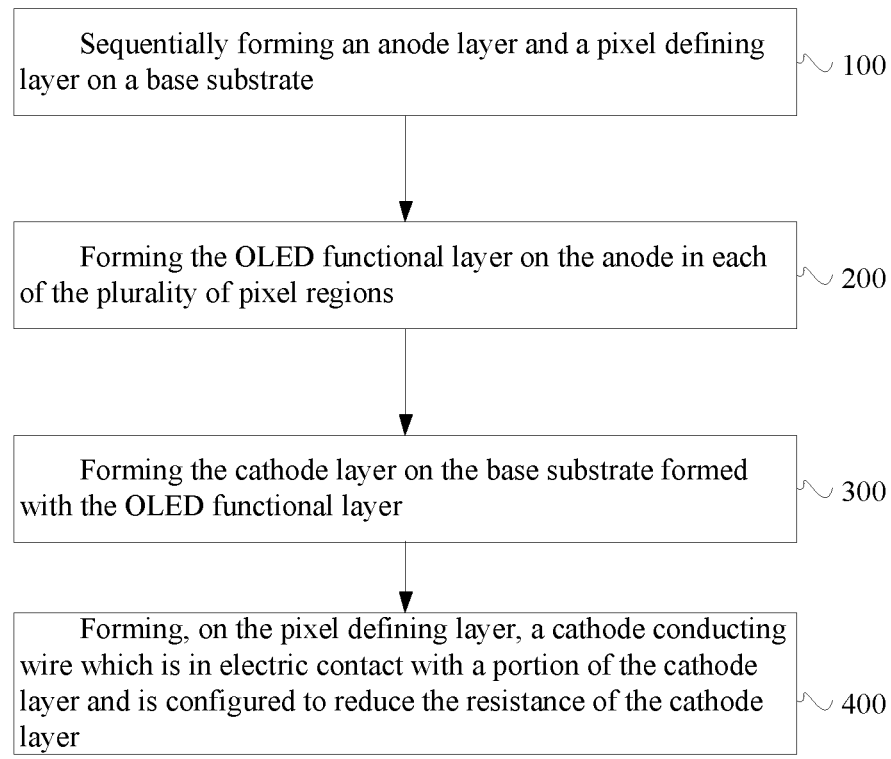
FIG. 6 is a flow diagram of a method of manufacturing an OLED display substrate, which is provided by an embodiment of the present disclosure.

In an embodiment of the present disclosure, FIG. 6 is a flow diagram of a method of manufacturing an OLED display substrate, which is provided by an embodiment of the present disclosure. As shown in FIG. 6, a method of manufacturing an OLED display substrate, which is provided by the embodiment of the present disclosure specifically includes the following steps.

In a step 100, an anode layer and a pixel defining layer are sequentially formed on a base substrate.

The anode layer includes a plurality of anodes arranged in an array and separated from one another, and the pixel defining layer has, for example, a mesh shape and defines a plurality of pixel regions. Optionally, the plurality of pixel regions may be arranged in an array and are in one-to-one correspondence with the plurality of anodes, each anode is located in one of the plurality of pixel regions, and the plurality of pixel regions may be defined to emit lights of the same color or different colors.

Optionally, the base substrate is a flexible base substrate, and a material of the base substrate is polyimide.

Optionally, the material of the anode is generally selected from transparent or translucent materials having good electrical conductivity and chemical stability and a high work function, such as indium tin oxide, silver, nickel oxide and graphene, and the anode may have a thickness of, for example, 1-2 µm.

Specifically, a method for forming the pixel defining layer on the base substrate may be gaseous phase deposition, spin coating, scrape coating, or the like. There is no limitation on the method in the present disclosure, and the method needs to be selected according to a film to be formed.

Optionally, the pixel defining layer has a thickness of 1.5-3 µm, and the material for the pixel defining layer may be, for example, an inorganic material (such as silicon nitride or silicon oxide), an organic material (such as polyimide or polytetrafluoroethylene), a photoresist (such as polyvinyl alcohol or laurate), or the like. There is no limitation on the material for the pixel defining layer in the present disclosure.

In a step 200, an organic light-emitting functional layer is formed on the anode in each of the plurality of pixel regions.

Specifically, the organic light-emitting functional layer is formed on the anode in each of the plurality of pixel regions by vapor deposition by means of a first mask.

Optionally, the first mask includes: a vapor deposition mask.

Optionally, the organic light-emitting functional layer may also be formed in other manners. For example, forming the organic light-emitting functional layer specifically includes: forming a hole transport layer on the base substrate formed with the anodes, by a chemical vapor deposition process, a physical vapor deposition (PVD) process, or a spin coating method, wherein the hole transport layer is generally formed of a material such as bipheny-based triaryl amine or a benzidine derivative, and generally has a thickness of 10-50 nm; forming an organic light-emitting layer on the base substrate formed with the hole transport layer, by a vapor deposition process, a spin coating process or an inkjet printing process, wherein the organic light-emitting layer may be a single organic substance such as 8-hydroxyquinoline aluminum salt and rubrene, may also be a substance with dopant such as 4, 4'-N, N'-dicarbazole-biphenyl doped with rubrene, may also be a phosphorescent material, or may further be a fluorescent material, and the organic light-emitting layer generally has a thickness of 1-50 nm; and forming an electron transport layer on the base substrate by a chemical vapor deposition process, a physical vapor deposition process, or a spin coating method, wherein the electron transport layer may be doped with a material such as metal Cs and generally has a thickness of 10-100 nm.

In a step 300, a cathode layer is formed on the base substrate formed with the organic light-emitting functional layer.

Optionally, the material of the cathode is generally selected from metal materials or alloy materials having a low work function. Moreover, in order to overcome a problem that a metal having a low work function, such as calcium, potassium, and lithium has a high chemical activity, the material of the cathode may be an alloy of the metal having the low work function and a corrosion resistant metal, such as a silver-magnesium alloy and an aluminum-lithium alloy.

In an embodiment, as shown in FIG. 2, the cathode layer 33 includes a plurality of cathodes 331 arranged in an array and separated from one another. The plurality of cathodes 331 correspond to the plurality of pixel regions P, respectively, and each of the plurality of cathodes 331 completely covers the organic light-emitting functional layer 32 in one of the plurality of pixel regions P, and covers an edge region, adjacent to the one pixel region P, of the top of the pixel defining layer 20. In this case, the organic light-emitting functional layer 32 in each of the pixel regions may have a same pattern as the cathode 331 corresponding to the organic light-emitting functional layer. In other words, an orthogonal projection of the organic light-emitting functional layer 32 in each pixel region on the base substrate 10 coincides with an orthogonal projection of the cathode 331 corresponding to the organic light-emitting functional layer on the base substrate 10. In this case, the plurality of organic light-emitting functional layers 32 and the cathode layer 33 may be vapor-deposited by means of a single vapor deposition mask.

In an embodiment, as shown in FIG. 4, the cathode layer 33 is a continuous electrode layer covering the entire base substrate, i.e. covering the pixel defining layer 20 and all of the plurality of pixel regions P. In this case, the vapor deposition mask is not needed when the cathode layer is vapor-deposited.

In an alternative embodiment, the cathode layer 33 is not a continuous electrode layer, but includes a plurality of cathode regions separated from one another and each corresponding to a plurality of pixel regions. In other words, the cathodes 331 corresponding to the plurality of pixel regions are spliced into one cathode region. For example, the cathode layer includes a plurality of cathode regions parallel to one another, and each cathode region corresponds to one or more rows of pixel regions or one or more columns of the pixel regions. In this case, the cathode may be vapor-deposited by means of a second vapor deposition mask.

In a step 400, a cathode conducting wire is formed on the pixel defining layer, for example on a top of the pixel defining layer. The cathode conducting wire is in electric contact with a portion of the cathode layer. The conducting wire is configured to reduce a resistance of the cathode layer.

Specifically, the step 400 includes: the cathode conducting wire is formed on the pixel defining layer by a vapor deposition process or a sputtering process. The cathode conducting wire may have various structures. Optionally, referring to FIG. 3A, the cathode conducting wire 40 includes a plurality of first cathode conducting wires 41, and each of the plurality of first cathode conducting wires 41 is located between two adjacent columns of pixel regions P. Optionally, the cathode conducting wire 40 includes a plurality of second cathode conducting wires 42, and each of the plurality of second cathode conducting wires is located between two adjacent rows of pixel regions P. Optionally, the cathode conducting wire 40 has a mesh shape and covers the top of the mesh-shaped pixel defining layer 20. The cathode conducting wire 40 defines a plurality of openings 43 each exposing one of the plurality of pixel regions P.

Optionally, the cathode layer formed in the step 300 is made of a first conductive material and has a first thickness, and the cathode conducting wire formed in the step 400 is made of a second conductive material and has a second thickness. Optionally, the first conductive material and the second conductive material are the same, and the first thickness is less than the second thickness. Optionally, the second thickness is 3-5 times the first thickness.

Optionally, the first conductive material and the second conductive material are different from each other, and the first conductive material has a greater resistivity than the second conductive material.

Specifically, common materials in increasing order of resistivity are: silver, copper, gold, aluminum, magnesium, and molybdenum. If the material of the cathode conducting wire is silver, the material of the cathode layer may be copper, gold, aluminum, magnesium, or molybdenum. If the material of the cathode conducting wire is copper, the material of the cathode layer is gold, aluminum, magnesium, or molybdenum. In other words, the material of the cathode layer is selected depending upon a selection of the material of the cathode conducting wire. There is no specific limitation on the material of the cathode conducting wire and the material of the cathode layer in the present disclosure.

Optionally, the method provided by the embodiment of the present disclosure further includes: forming a flexible base substrate, prior to the step 100.

Specifically, forming the flexible base substrate specifically includes: coating a solution-like polyimide on a rigid base substrate and curing the polyimide at a high temperature, thereby forming the flexible base substrate; or adhering a filmy polyimide base substrate to the rigid base substrate through an adhesive.

Optionally, the rigid base substrate includes glass, quartz, and the like.

The method of manufacturing the OLED display substrate, which is provided by the embodiments of the present disclosure, includes: sequentially forming, on the base substrate, the anode layer and the pixel defining layer defining the plurality of pixel regions; forming the organic light-emitting functional layer on the anode in each of the plurality of pixel regions; forming the cathode layer on the base substrate formed with the organic light-emitting functional layer; and forming, on the pixel defining layer, the cathode conducting wire configured to reduce the resistance of the cathode layer. With the technical solution according to the embodiments of the present disclosure, the cathode conducting wire is disposed on the pixel defining layer. Hence, the resistance of the entire cathode layer is reduced so that a voltage drop is uniformly distributed in the pixel regions, thereby improving the uniformity of light emitted from the OLED display substrate and the display quality of the OLED display substrate.

The method of manufacturing the OLED display substrate, which is provided by the embodiment of the present disclosure, is further specifically described as below by taking as an example a manufacture of the OLED display substrate shown in FIG. 2 in conjunction with FIGS. 7A-7C.

Figure 7A:
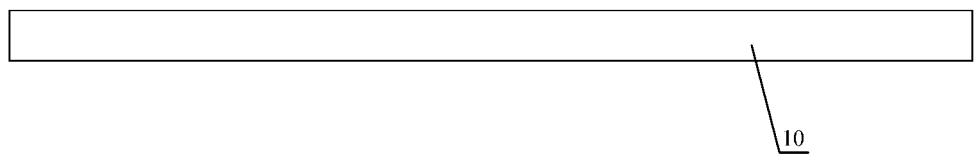
FIGS. 7A-7C are schematic views showing structures of an OLED display substrate respectively corresponding to steps of a method of manufacturing the OLED display substrate, which is provided by an embodiment of the present disclosure.

In a step 710, a base substrate 10 is formed as specifically shown in FIG. 7A.

Optionally, the base substrate 10 is a flexible base substrate, and a material of the base substrate 10 is polyimide. It should be understood that the base substrate 10 may be cleaned in advance before a thin film transistor 50 is formed on the base substrate 10.

Figure 7B:
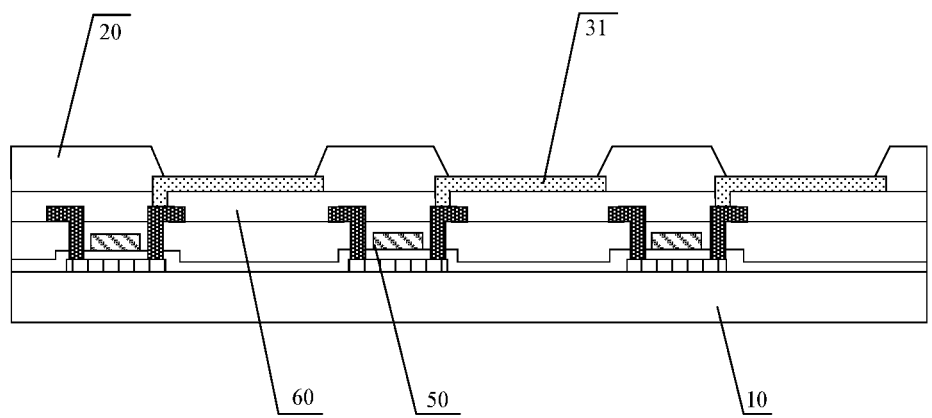

In a step 720, a plurality of thin film transistors 50, a planarization layer 60, a plurality of anodes 31 arranged in an array and separated from one another, and a pixel defining layer 20 are sequentially formed on the base substrate 10 as specifically shown in FIG. 7B.

Specifically, each of the thin film transistors 50 includes: an active layer and a gate electrode disposed over the active layer. A gate insulating layer covering the entire base substrate is between the active layer and the gate electrode, and an interlayer insulating layer covering the entire base substrate is disposed on the gate electrode. Each of the thin film transistors 50 further includes: a source electrode and a drain electrode disposed on the interlayer insulating layer and connected to the active layer through via holes, and a passivation layer covering the entire base substrate is disposed on a source and drain electrode layer including the source electrode and the drain electrode. The planarization layer 60 covers the base substrate 10. Each of the plurality of anodes 31 is electrically connected to the drain electrode of one of the plurality of thin film transistors 50 through a via hole formed in the planarization layer 60.

Optionally, a material of the anode 31 generally is indium tin oxide (ITO), indium zinc oxide (IZO), aluminum zinc oxide (AZO), or the like. A material of the planarization layer 60 is polyimide (PI), and the planarization layer has a thickness of 1-3 μm. Further, the planarization layer functions to flatten a surface of the thin film transistors.

Figure 7C:
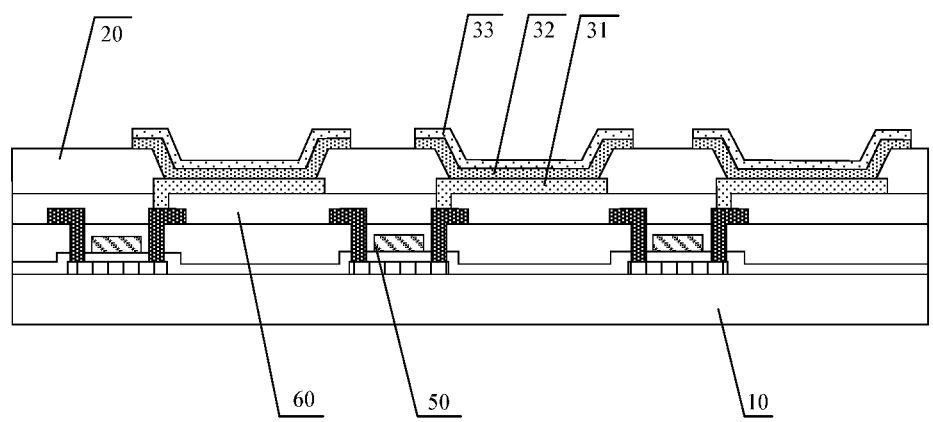

In a step 730, an organic light-emitting functional layer 32 and a cathode 331 are formed on each of the anodes 31 as specifically shown in FIG. 7C.

Specifically, in the step 730, the organic light-emitting functional layer 32 and the cathode 331 may be formed by vapor deposition by means of a first mask; or the organic light-emitting functional layer 32 is formed on the anode 31 in each of the plurality of pixel regions by vapor deposition by means of the first mask; and the cathode 331 is formed on the organic light-emitting functional layer by vapor deposition or sputtering by means of a second mask. The cathode 331 has a same pattern as the organic light-emitting functional layer 32.

In a step 740, the cathode conducting wire 40 is formed on the pixel defining layer 20 as specifically shown in FIG. 2.

An embodiment of the present disclosure provides a display apparatus including an OLED display substrate.

The OLED display substrate of the display apparatus in the present embodiment includes the OLED display substrate provided by any one of the above embodiments of the present disclosure, and has the same achieved effect and achieving principles as the latter, which are no longer described for the sake of brevity. It is to be noted that the OLED display substrate is a top-emission OLED display substrate.

Specifically, the display apparatus may include any products or parts having a displaying function, such as a mobile phone, a tablet computer, a TV, a display, a notebook computer, a digital frame, a navigator, and an electronic paper.

The following should be noted:

only structures and configurations relating to the embodiments of the present disclosure are shown in the drawings of the embodiments of the present disclosure, and common designs may be referred to for other structures and configurations;

a thickness and a size of a layer or a microstructure are enlarged in the drawings for describing the embodiments of the present disclosure for the purpose of clarity; it can be understood that when an element such as a layer, a film, a region or a base substrate is referred to as being "on" or "under" another element, the element may be directly on or under the other element, or there may be an intermediate element between them; and the embodiments of the present disclosure and/or the features in the embodiments may be combined with each other to obtain a new embodiment unless they conflict.

Although the above embodiments are disclosed in the present disclosure, the described contents are only embodiments for facilitating understanding the present disclosure, and are not intended to limit the present disclosure. Those skilled in the art may make any changes and modifications to the embodiments in form and detail without departing from the spirit and principles of the present disclosure. However, the protection scope of the present disclosure should be defined by the scope of the appended claims.

What is claimed is:

1. An organic light-emitting diode display substrate, comprising:
   a base substrate;
   a pixel defining layer on the base substrate and defining a plurality of pixel regions, wherein a first electrode, a second electrode and an organic light-emitting functional layer between the first electrode and the second electrode are disposed in each of at least two adjacent ones of the plurality of pixel regions; and
   a conducting wire on the pixel defining layer and configured to connect the second electrodes located in the at least two adjacent pixel regions,
   wherein the second electrodes in the at least two adjacent pixel regions are separated from each other.

2. The organic light-emitting diode display substrate of claim 1, wherein:
   an orthogonal projection of each of the second electrodes in the at least two adjacent pixel regions on the base substrate coincides partially with an orthogonal projection of the conducting wire on the base substrate.

3. The organic light-emitting diode display substrate of claim 1, wherein:
   a material of the conducting wire is the same as a material of the second electrodes, or
   the material of the conducting wire has lower resistivity than the material of the second electrodes.

4. The organic light-emitting diode display substrate of claim 3, wherein:
   the conducting wire has a greater thickness than the second electrodes.

5. The organic light-emitting diode display substrate of claim 1, wherein:
   orthogonal projections of the second electrode and the organic light-emitting functional layer in each of the at least two adjacent pixel regions on the base substrate coincide with each other.

6. The organic light-emitting diode display substrate of claim 1, wherein:
   the plurality of pixel regions are arranged at intervals in an array, and the first electrode, the second electrode and the organic light-emitting functional layer between the first electrode and the second electrode are disposed in each of the plurality of pixel regions.

7. The organic light-emitting diode display substrate of claim 6, wherein:
   the conducting wire comprises a plurality of first conducting wires, and each of the plurality of first conducting wires is located between two adjacent columns of pixel regions of the plurality of pixel regions, and is electrically connected to the second electrode in each of the two adjacent columns of pixel regions.

8. The organic light-emitting diode display substrate of claim 6, wherein:
   the conducting wire comprises a plurality of second conducting wires, and each of the plurality of second conducting wires is located between two adjacent rows of pixel regions of the plurality of pixel regions, and is electrically connected to the second electrode in each of the two adjacent rows of pixel regions.

9. The organic light-emitting diode display substrate of claim 6, wherein:
   the conducting wire has a mesh shape, defines a plurality of openings each corresponding to one of the plurality of pixel regions, and is electrically connected to the second electrode in each of the plurality of pixel regions.

10. The organic light-emitting diode display substrate of claim 1, wherein:
    the first electrode comprises an anode, and the second electrode comprises a cathode.

11. A display apparatus comprising:
    the organic light-emitting diode display substrate of claim 1.

12. A method of manufacturing an organic light-emitting diode display substrate, the method comprising:
    sequentially forming a first electrode layer and a pixel defining layer on a base substrate, wherein the first electrode layer comprises a plurality of first electrodes, the pixel defining layer defines a plurality of pixel regions, and in each of at least two adjacent ones of the plurality of pixel regions, one of the plurality of first electrodes is disposed;
    sequentially forming an organic light-emitting functional layer and a second electrode on the first electrode in each of the at least two adjacent pixel regions; and
    forming a conducting wire on the pixel defining layer, wherein the conducting wire is configured to connect the second electrodes located in the at least two adjacent pixel regions,
    wherein the second electrodes in the at least two adjacent pixel regions are separated from each other.

13. The method of claim 12, wherein:
    an orthogonal projection of the second electrode in each of the at least two adjacent pixel regions on the base substrate coincides partially with an orthogonal projection of the conducting wire on the base substrate.

14. The method of claim 12, wherein:
    the conducting wire is formed of a same material as the second electrodes, or
    a material of the conducting wire has lower resistivity than a material of the second electrodes.

15. The method of claim 14, wherein:
    the conducting wire has a greater thickness than the second electrodes.

16. The method of claim 12, wherein:
    the organic light-emitting functional layer and the second electrode in each of the at least two adjacent pixel regions are formed by means of a same mask.

* * * * *